(12) United States Patent
Carlino et al.

(10) Patent No.: US 7,358,836 B2
(45) Date of Patent: Apr. 15, 2008

(54) SHIELD, AND PRINTED CIRCUIT BOARD AND ELECTRICAL APPARATUS EMPLOYING THE SAME

(75) Inventors: Harry J. Carlino, Export, PA (US); Todd M. Shaak, Presto, PA (US); Martha Suryani, Coraopolis, PA (US); Lloyd A. Maloney, Beaver, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/391,851

(22) Filed: Mar. 29, 2006

(65) Prior Publication Data

US 2007/0232144 A1  Oct. 4, 2007

(51) Int. Cl.
*H01H 75/00* (2006.01)

(52) U.S. Cl. .............................. 335/6; 335/21; 335/202; 361/837

(58) Field of Classification Search ................ 335/202, 335/6, 21; 361/705, 816, 819, 837
See application file for complete search history.

(56) References Cited

U.S. PATENT DOCUMENTS

| | | | |
|---|---|---|---|
| 3,616,533 A * | 11/1971 | Heap et al. .................... | 29/837 |
| 4,568,899 A | 2/1986 | May et al. | |
| 4,652,975 A | 3/1987 | Scott | |
| 4,667,263 A | 5/1987 | Morris et al. | |
| 5,180,513 A | 1/1993 | Durand | |
| 5,221,919 A * | 6/1993 | Hermans .................... | 340/567 |
| 5,258,733 A | 11/1993 | Link et al. | |
| 5,325,315 A * | 6/1994 | Engel et al. ................. | 702/105 |
| 5,991,155 A * | 11/1999 | Kobayashi et al. ......... | 361/705 |
| 6,278,605 B1 | 8/2001 | Hill | |
| 6,522,228 B2 | 2/2003 | Wellner et al. | |
| 6,542,056 B2 | 4/2003 | Nerstrom et al. | |
| 6,545,574 B1 | 4/2003 | Seymour et al. | |
| 6,710,688 B2 | 3/2004 | Wellner et al. | |
| 6,842,325 B2 | 1/2005 | Meehleder et al. | |
| 6,921,873 B2 | 7/2005 | Puskar et al. | |
| 2004/0026757 A1 | 2/2004 | Crane, Jr. et al. | |
| 2007/0158100 A1* | 7/2007 | Greenberg et al. .......... | 174/254 |

FOREIGN PATENT DOCUMENTS

JP         2005064266 A  *  3/2005

* cited by examiner

*Primary Examiner*—Ramon M. Barrera
(74) *Attorney, Agent, or Firm*—Martin J. Moran

(57) ABSTRACT

A shield is provided for a circuit breaker including a printed circuit board (PCB). The PCB is a generally planar member with a plurality of electrical components each having a corresponding shape. The shield includes at least one resilient sheet member at least partially covering the generally planar member and at least one of the electrical components coupled thereto. The resilient sheet member generally conforms to the corresponding shape of the at least one of the electrical components in order to shield and protect it from debris and to resist accumulation of gas-carried carbon. The resilient sheet member is made from a material, such as silicon rubber, which is flexible and elastic within a temperature range of about −70 to about 450 degrees Fahrenheit, and it is flame-resistant, tear and abrasion-resistant, impervious to moisture and chemicals, fungus-resistant, and resistant to outgassing.

10 Claims, 3 Drawing Sheets

SHIELD, AND PRINTED CIRCUIT BOARD AND ELECTRICAL APPARATUS EMPLOYING THE SAME

BACKGROUND OF THE INVENTION

1. Field of the Invention

The present invention relates generally to electrical apparatus and, more particularly, to shields for protecting electrical components of electrical apparatus. The invention further relates to printed circuit boards employing shields, and to electrical apparatus employing printed circuit boards having a shield.

2. Background Information

Electrical apparatus such as, for example, a molded case circuit breaker having an electronic trip unit, include a plurality of electrical components which are susceptible to damage and, therefore, must be protected.

Specifically, the electronic trip unit of the molded case circuit breaker typically includes a printed circuit board (PCB), with a plurality of electrical components being coupled to the PCB. The PCB facilitates tripping the circuit breaker in response to a trip condition (e.g., without limitation, an overcurrent condition, an overload condition, or a relatively high level short circuit or fault condition). A high current fault interruption, for example, typically results in a substantial arc in the arc chamber of the circuit breaker. The arc forms rapidly expanding gases, and may generate flames and flying debris comprised of molten metal particles and fragments of various circuit breaker components which are expelled throughout the breaker. As a consequence, the electrical components of the PCB may be susceptible to malfunction due, for example, to physical harm caused by the arc, or to a short circuit or open circuit caused by exposure to the byproducts of the arc.

PCBs employ a conformal coating (e.g., for example and without limitation, Humiseal® available from Chase Specialty Coatings which has a place of business in Pittsburgh, Pa.) primarily to protect against humidity and undesirable affects associated therewith. However, such coatings provide only relatively minor protection during high current fault interruption. As such, in order to shield the electrical components from flying debris, one known prior proposal has been to surround and enclose the PCB in a thermoplastic clamshell-type molded casing or shield. However, holes in the clamshell, such as thru holes for receiving components and openings between the halves of the clamshell, allow gas-carried carbon to enter and accumulate. The gas-carried carbon can become trapped proximate sensitive electrical components resulting in an undesirable condition. Specifically, carbon film deposits which coat the PCB as hot gases escape, cause high leakage current which is a leading cause of PCB malfunction and/or failure. Moreover, the trapped carbon can cause short circuits between adjacent electrical components and/or reduce normal conductivity that undesirably inhibits the flow of electrical current. In addition, assembly of the thermoplastic clamshell is a labor and cost intensive process which involves placing the clamshell halves around the PCB and then securing one half to the other.

There is, therefore, room for improvement in shields for electrical apparatus.

There is also room for improvement in printed circuit boards, and in electrical apparatus, such as electronic molded case circuit breakers, which employ printed circuit boards.

SUMMARY OF THE INVENTION

These needs and others are met by the present invention, which is directed to a resilient shield for covering and thereby shielding and protecting select electrical components of an electrical apparatus.

As one aspect of the invention, a shield is provided for an electrical apparatus including a generally planar member and a plurality of electrical components which are coupled to the generally planar member, each of the electrical components having a corresponding shape. The shield comprises: a resilient sheet member structured to overly at least one of the electrical components coupled to the generally planar member, wherein the resilient sheet member generally conforms to the corresponding shape of the at least one of the electrical components in order to shield and protect the at least one of the electrical components.

The resilient sheet member may include a first side and a second side, wherein the second side of the resilient sheet member comprises an adhesive, and wherein the adhesive is structured to maintain the position of the resilient sheet member over the at least one of the electrical components. The resilient sheet member may be made from a material which is flexible and elastic within a temperature range of about −70 to about 450 degrees Fahrenheit, such as, for example and without limitation, silicon rubber, and may exhibit at least one attribute selected from the group consisting of flame resistance, tear and abrasion resistance, imperviousness to moisture and chemicals, fungus resistance, and resistance to outgassing. The resilient sheet member may be generally planar, and it may have a thickness of between about 0.005 to about 0.03 inches.

As another aspect of the invention, a printed circuit board is provided for an electrical apparatus. The printed circuit board comprises: a generally planar member; a plurality of electrical components coupled to the generally planar member, each of the electrical components having a corresponding shape; and a shield comprising: at least one resilient sheet member at least partially covering the generally planar member and at least one of the electrical components coupled thereto, wherein the resilient sheet member generally conforms to the corresponding shape of the at least one of the electrical components in order to shield and protect the at least one of the electrical components.

At least one of the at least one resilient sheet member may comprise a single continuous piece. The generally planar member of the printed circuit board may have a first shape wherein at least one of the at least one resilient sheet member has a second shape, and wherein the second shape generally corresponds with the first shape of the generally planar member of the printed circuit board. The resilient sheet member may comprise at least one of a slot and an aperture wherein at least one of the electrical components of the printed circuit board is disposed within the at least one of the slot and the aperture in order not to be covered by the shield. The generally planar member of the printed circuit board may comprise a first side and a second side, and the at least one resilient sheet member may comprise a plurality of resilient sheet members, wherein at least one of the resilient sheet members is disposed on the first side of the generally planar member, and wherein at least one of the resilient sheet members is disposed on the second side of the generally planar member.

As another aspect of the invention, an electrical apparatus comprises: a housing; separable contacts inside the housing; a trip unit including a printed circuit board, the trip unit including a well known operating mechanism structured to trip open the separable contacts in response to a trip condition, the printed circuit board including a generally planar member and a plurality of electrical components coupled to the generally planar member, each of the electrical components having a corresponding shape; and a shield covering at least one of the electrical components, the shield comprising: at least one resilient sheet member at least partially covering the generally planar member and the at least one of the electrical components coupled to the generally planar member, and wherein the at least one resilient sheet member generally conforms to the corresponding shape of the at least one of the electrical components in order to shield and protect the at least one of the electrical components from debris and to resist accumulation of gas-carried carbon.

The electrical apparatus may be a circuit breaker. The electrical components which are coupled to the printed circuit board of the circuit breaker may include components selected from the group consisting of resistors, capacitors, diodes, transistors, integrated circuits, electrical connectors, and conductors.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
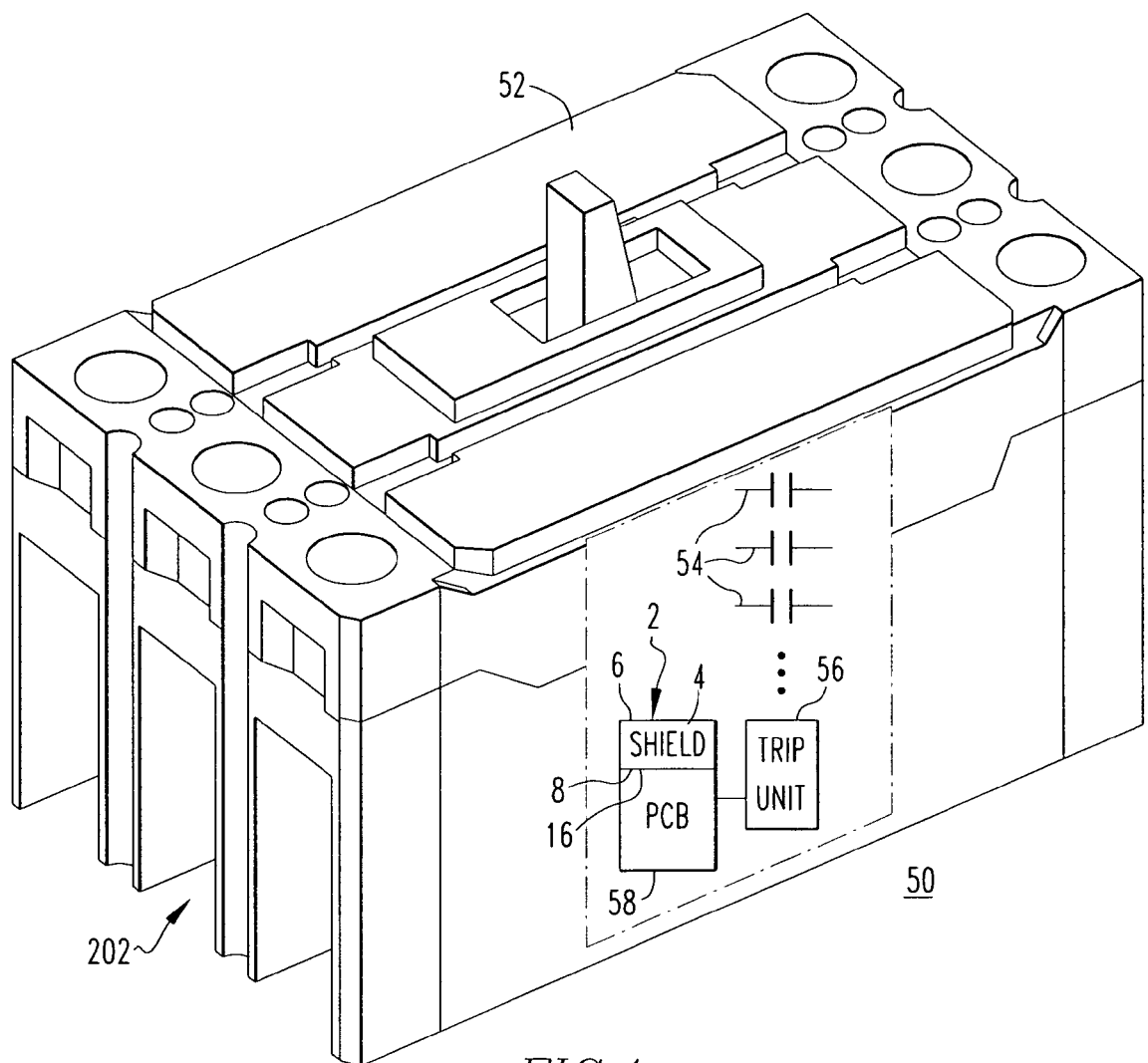
FIG. 1 is a simplified isometric view of a three-pole circuit breaker with internal components, including a printed circuit board and shield therefor in accordance with the invention.

For purposes of illustration, the invention will be described as applied to printed circuit boards (PCBs) for the electronic trip unit of a molded case circuit breaker (MCCB), although it will become apparent that it could also be applied to shield and protect the electrical components of a wide variety of electrical apparatus in many different applications.

Directional phrases used herein, such as, for example, left, right, front, back and derivatives thereof, relate to the orientation of the elements shown in the drawings and are not limiting upon the claims unless expressly recited therein.

As employed herein, the term "fastener" refers to any suitable connecting or tightening mechanism expressly including, but not limited to, rivets, screws, and adhesives.

As employed herein, the term "adhesive" refers to any suitable glue, tape (e.g., double-sided tape), or other suitable material for adhering one part to another without requiring the use of mechanical fasteners, such as, for example and without limitation, rivets or screws.

As employed herein, the statement that two or more parts are "coupled" together shall mean that the parts are joined together either directly or joined through one or more intermediate parts.

As employed herein, the term "resilient" refers to the elastic and flexible nature of the material which comprises the shield of the invention, which enables the shield to generally conform to the shape of, and thereby shield and protect, the electrical component(s) that the shield covers.

As employed herein, the term "number" shall mean one or more than one (i.e., a plurality).

FIG. 1 shows a molded case circuit breaker 50 employing a trip unit 56 including a printed circuit board (PCB) 58 having a shield 2, in accordance with the present invention. The circuit breaker 50 in the example of FIG. 1, is a three pole molded case circuit breaker 50 including a housing 52 and three pairs of separable contacts 54 inside the housing 52. The trip unit 56 includes the printed circuit board 58, and a well known operating mechanism structured to trip open the separable contacts 54 in response to a trip condition. The separable contacts 54, trip unit 56, printed circuit board 58 and shield 2 therefor, of FIG. 1, are shown in simplified schematic form for ease of illustration.

Figure 2:
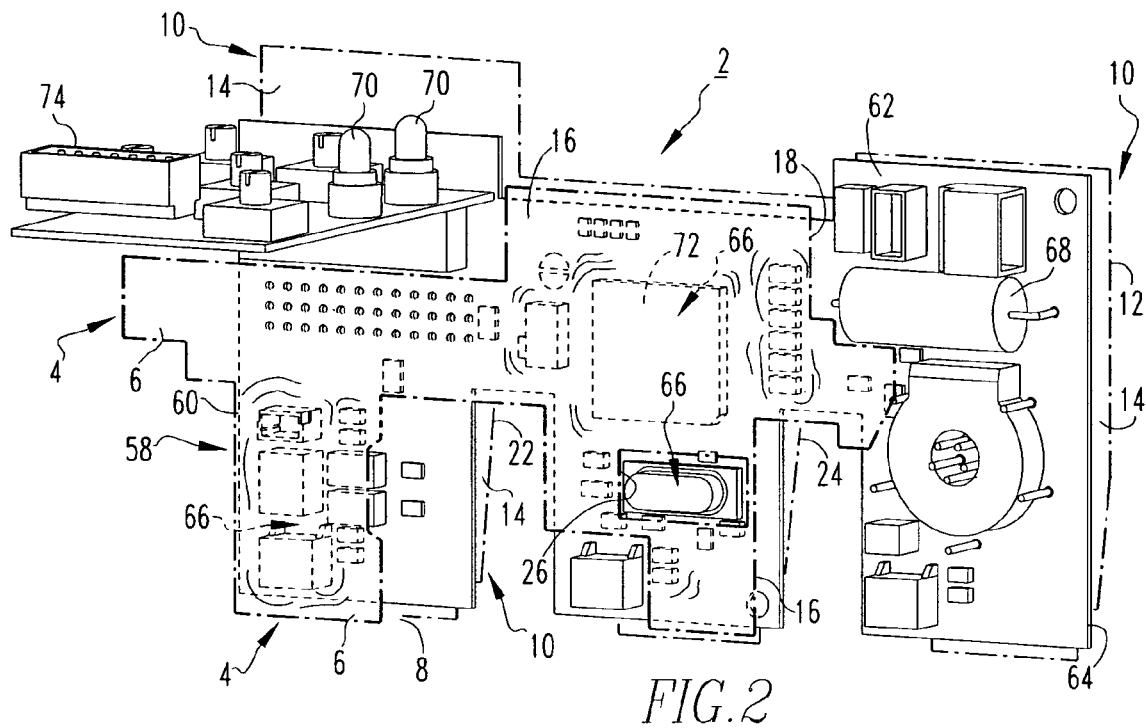
FIG. 2 is an isometric view of the front of a printed circuit board and shield therefor, in accordance with an embodiment of the invention.
Figure 3:
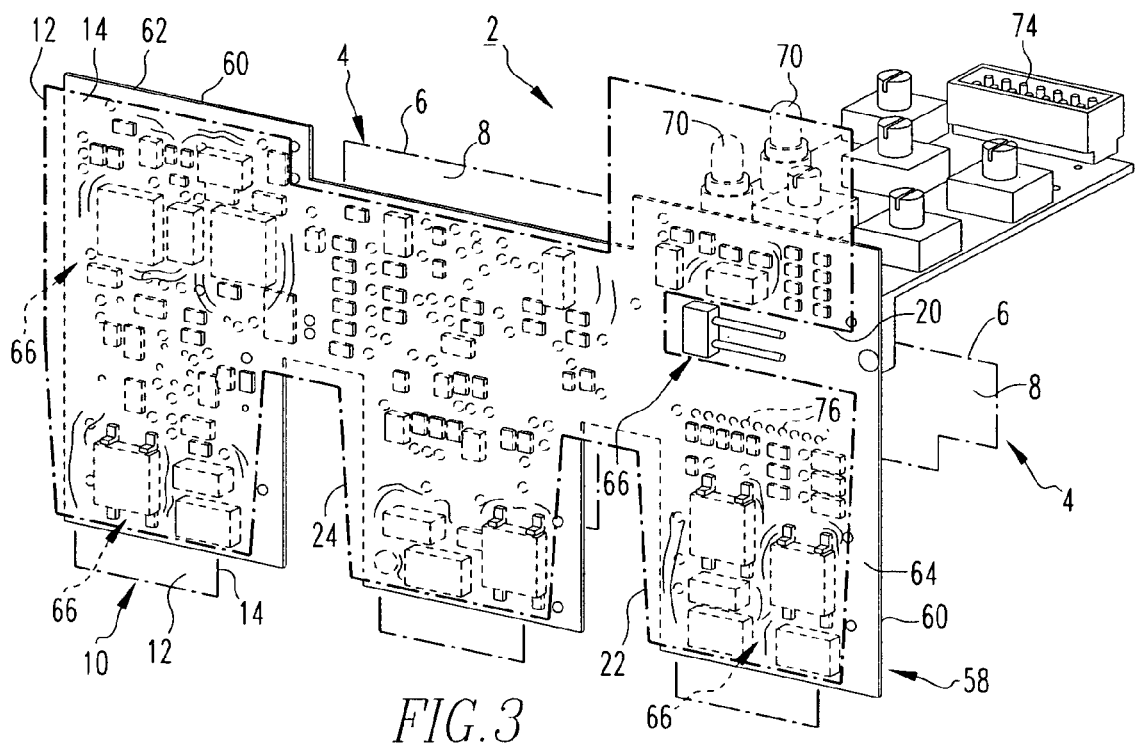
FIG. 3 is an isometric view of the back of the printed circuit board of FIG. 2 and the shield therefor.

A more detailed view of one possible printed circuit board 58 and shield 2 therefor, is provided in FIGS. 2 and 3, which illustrate the first side or front 62 and second side or back 64, respectively, of the printed circuit board 58. Specifically, the printed circuit board 58 comprises a generally planar member 60 including a plurality of electrical components 66, which are coupled to the generally planar member 60 in one or more manners well known to those skilled in the art. Each of the electrical components 66 has a corresponding shape. It will be appreciated that the phrase "electrical components" as employed herein, refers to any known or suitable component or element that is suitable for application on the exemplary printed circuit board 58, and expressly includes, but is not limited to, resisters 68, capacitors, diodes, light emitting diodes 70, transistors, integrated circuits 72 (e.g., without limitation, microprocessors), electrical connectors 74 and conductors 76 (e.g., without limitation, conductive traces).

The shield 2 (shown in phantom line drawing in FIGS. 2 and 3) comprises one or more resilient sheet members, such as 4, 10, which at least partially cover the generally planar member 60 of the printed circuit board 58, and one or more of the electrical components 66 coupled thereto. More specifically, the resilient sheet members 4, 10 generally conform to the corresponding shape(s) of particular electrical component(s) 66, which it covers (see, for example, microprocessor 72 covered by shield 4 in the example of FIG. 2), in order to shield and protect the electrical component (e.g., 72). For example, and without limitation, the resilient sheet member 4 shields and protects the electrical component (e.g., 72) from debris, gas-carried carbon, and other harmful byproducts associated with a relatively high level fault-type trip condition, as previously discussed.

In the example of FIGS. 2 and 3, the shield 2 includes a pair of first and second resilient sheet members 4, 10 which are disposed on the first and second sides 62, 64, respectively, of the generally planar member 60 of printed circuit board 58. It will, however, be appreciated that any known or suitable number of resilient sheet members could be employed on various portions of one or both sides 62, 64 of the generally planar member 60 in order to at least partially overly at least one of the electrical components 66 coupled thereto, and shield and protect it in accordance with the invention. Each of the resilient sheet members 4, 10 of shield 2 preferably comprises a single continuous piece of material, and is generally planar in configuration.

The exemplary resilient sheet members 4, 10 of shield 2 are made from a material which is flexible and elastic within a temperature range of about −70 to about 450 degrees Fahrenheit. The material also exhibits at least one attribute selected from the group consisting of flame resistance, tear and abrasion resistance, imperviousness to moisture and chemicals, fungus resistance, and resistance to outgassing. The term "outgassing" as employed herein is used in accordance with its traditional meaning within the art. Specifically, the material of the shield 2 in accordance with the invention preferably does not give-off or expel a gas, for example, when exposed to a relatively high temperature for an extended period of time. One material which exhibits the foregoing desired attributes and, therefore, may advantageously be employed to form the shield 2 of the invention is cured silicon rubber and, in particular, liquid silicon rubber (LSR). LSR, which is available from Stockwell Elastomerics, Inc. having a place of business in Philadelphia, Pa., is a material which typically originates as two liquid components which are mixed together and cured. Cured LSR exhibits substantially no outgassing of, for example, volatiles and plasticizers, which could be harmful to electronic assemblies. Therefore, whereas many electronic assemblies have traditionally been required to be silicone free because of the potential harm that could result from the silicon outgassing, cured silicon rubber and, in particular, cured LSR is compatible for safe use with electronic devices. In accordance with one example of the invention, LSR is cured into a generally planar sheet, for example and without limitation, by injection molding. The sheet of LSR is then trimmed (e.g., without limitation, die-cut) to the desired shape in order to form the corresponding resilient sheet member 4 or 10 of shield 2.

In this manner, the resilient sheet members 4, 10 of shield 2 can be made to have a shape which generally conforms to the shape of the generally planar member 60 of printed circuit board 58. More specifically, with respect to resilient sheet member 4 of FIG. 2, the first side 62 of generally planar member 60 has a first shape, and the resilient sheet member 4 has been made (e.g., molded, trimmed, or cut) to have a second shape which generally corresponds with the first shape of first side 62 of the generally planar member 60. It will be appreciated, with reference to FIG. 3, that resilient sheet member 10 can likewise be made to have a shape which generally corresponds to the second side 64 of the generally planar member 60. In other words, the resilient sheet members 4, 10 include a plurality of slots 18, 20, 22, 24 and/or apertures 26 (one aperture 26 is shown in FIG. 2), in order to generally match the shape of the surface (e.g., first side 62 or second side 64) of the generally planar member 60 on which the resilient sheet member 4, 10 will be disposed, while simultaneously overlaying only the desired electrical components 66 coupled thereto. Thus, the slots 18, 20, 22, 24 and apertures 26 serve the additional purpose of permitting one or more of the electrical components 66 to reside within the slot or aperture and, therefore, not be covered by shield 2. In this manner, the shield 2 of the invention is employed to selectively cover only those electrical components 66 for which protection from the aforementioned potentially harmful trip condition is necessary. By way of example, in FIG. 2, a slot 18 in resilient sheet member 4 provides a cut-out for a resistor 68 in order that the resistor 68 is not covered by the shield 2. Similarly, the resilient sheet member 4 includes an aperture 26 corresponding to electrical component 66 such that the electrical component 66 is disposed within aperture 26 and, therefore, is not covered by the shield 2. A slot 20 is also shown on the second side or back 64 of the printed circuit board 58 in the example of FIG. 3. Specifically, the slot 20 or cut-out in resilient sheet member 10 receives electrical component 66 such that it is not covered by the shield 2. The example of FIGS. 2 and 3 also shows additional electrical components which are not covered by shield 2, such as, for example and without limitation, a pair of LEDs 70 and a number of connectors 74.

It will be appreciated that the examples shown and described represent only one possible configuration of the shield 2 in accordance with the invention. Specifically, it will be appreciated that the shield 2 could be employed in a wide variety of alternative configurations in order to selectively overlay and protect any known or suitable electrical components in addition to, or other than, the electrical components 66 shown. Accordingly, the present invention provides a shield 2, which can be readily adapted to shield and protect a wide variety of existing electrical apparatus and electrical components therefor.

In order to further ensure that the position of the resilient members 4, 10 over the electrical components 66 is maintained, the resilient sheet members 4, 10 may optionally further include an adhesive which secures the resilient sheet members 4, 10 to the printed circuit board 58. For example, resilient sheet member 4 includes a first side 6 and a second side 8. The second side 8 comprises the adhesive 16 such that the resilient sheet member 4 is adhered to the printed circuit board 58 with the second side 8 being coupled to at least a portion of the first side 62 of generally planar member 60 of the printed circuit board 58. The first side 6 of the resilient sheet member 4 is disposed opposite second side 8, facing outward from the generally planar member 60 of printed circuit board 58, as shown. Similarly, resilient sheet member 10 includes a first side 12 and a second side 14, the second side 14 comprising the adhesive 16 in order to adhere to the second side 14 to at least a portion of the second side 64 of generally planar member 60. It will, however, be appreciated that any known or suitable alternative fastening mechanism (e.g., without limitation, fastener(s)) could be employed other than, or in addition to, adhesive 16.

Figure 4:
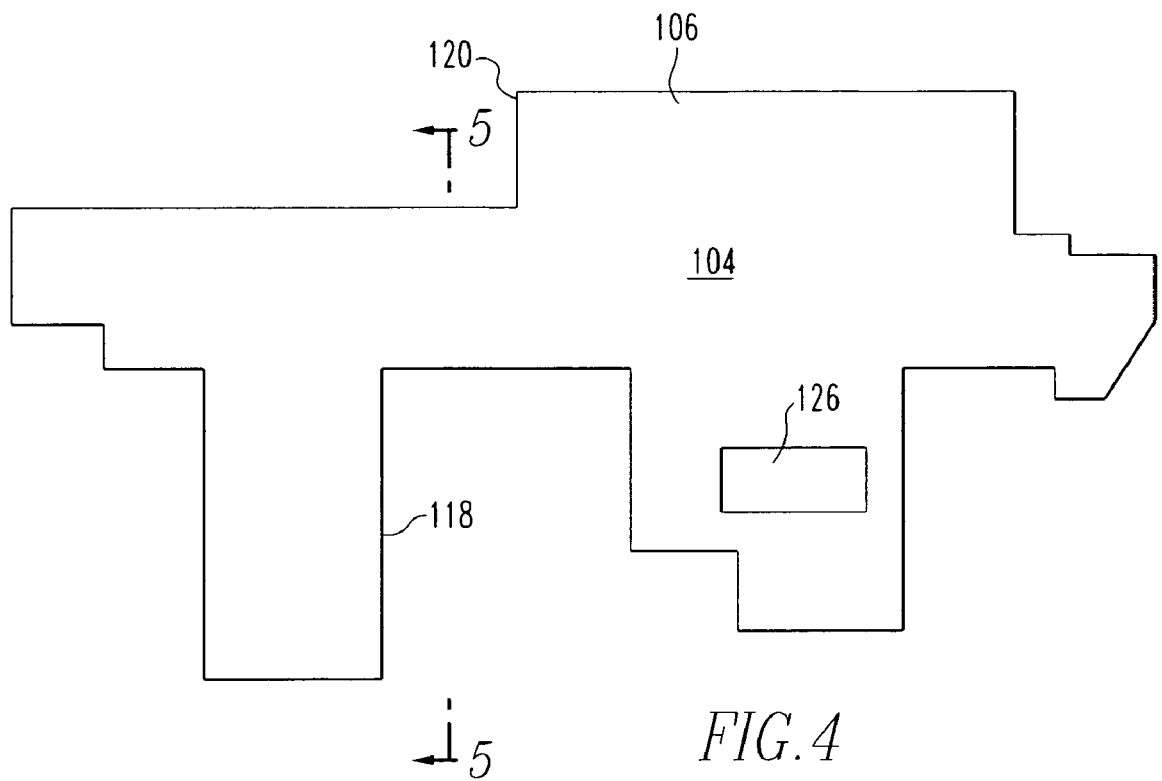
FIG. 4 is a plan view of a shield in accordance with another embodiment of the invention.
Figure 5:
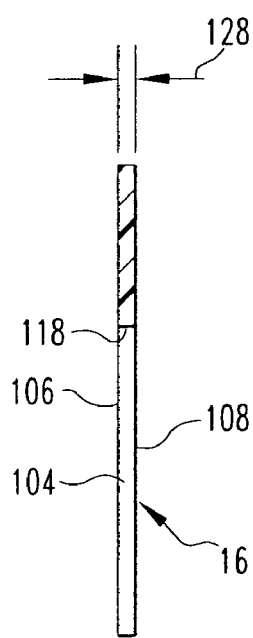
FIG. 5 is a cross-sectional view taken along line 5-5 of FIG. 4.

FIGS. 4 and 5 show a shield 102 in accordance with an alternative example of the invention. Specifically, the shield 102 comprises a single resilient sheet member 104 having a first side 106 (FIG. 4) and a second side 108 (FIG. 5). The resilient sheet member 104 is generally planar and comprises a single continuous piece. Additionally, the resilient sheet member 104 is die-cut or otherwise suitably formed to include a number of slots 118, 120, and an aperture 126. As shown in FIG. 5, the resilient sheet member 104 has a thickness 128 measured between the first side 106 and second side 108. The thickness 128 is preferably between about 0.005 to about 0.03 inches, and more preferably about 0.01 to about 0.02 inches. It will, however, be appreciated that resilient sheet members in accordance with the invention could have any suitable thickness based upon the particular application for which it will be employed. It will also be appreciated that the resilient sheet member 104 could have a variable thickness without departing from the scope of the invention. Accordingly, the examples shown and described hereinabove have been provided solely for purposes of ease of illustration, and are not meant to be limiting upon the scope of the invention.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An electrical apparatus comprising:
   a housing;
   separable contacts inside said housing;
   a trip unit including a printed circuit board, said trip unit being structured to trip open said separable contacts in response to a trip condition, said printed circuit board including a generally planar member and a plurality of electrical components coupled to said generally planar member, each of said electrical components having a corresponding shape; and
   a shield covering at least one of said electrical components, said shield comprising:
      at least one resilient sheet member at least partially covering said generally planar member and said at least one of said electrical components coupled to said generally planar member, and
      wherein said at least one resilient sheet member generally conforms to the corresponding shape of said at least one of said electrical components in order to shield and protect said at least one of said electrical components from debris and to resist accumulation of gas-carried carbon.

2. The electrical apparatus of claim 1 wherein said at least one resilient sheet member of said shield comprises a first side and a second side; wherein said second side comprises an adhesive; and wherein said adhesive adheres said at least one resilient sheet member to said generally planar member in order to maintain the position of said shield on said printed circuit board.

3. The electrical apparatus of claim 1 wherein said generally planar member of said printed circuit board has a first shape; wherein at least one of said at least one resilient sheet member comprises a single continuous piece having a second shape; and wherein the second shape of said single continuous piece generally corresponds with the first shape of said generally planar member of said printed circuit board.

4. The electrical apparatus of claim 1 wherein said at least one resilient sheet member comprises at least one of a slot and an aperture; wherein at least one of said electrical components of said printed circuit board is disposed within said at least one of said slot and said aperture in order not to be covered by said shield.

5. The electrical apparatus of claim 1 wherein said generally planar member of said printed circuit board comprises a first side and a second side; wherein said at least one resilient sheet member comprises a plurality of resilient sheet members; wherein at least one of said resilient sheet members is disposed on the first side of said generally planar member; and wherein at least one of said resilient sheet members is disposed on the second side of said generally planar member.

6. The electrical apparatus of claim 1 wherein said electrical apparatus is a circuit breaker; and wherein said electrical components which are coupled to the printed circuit board of said circuit breaker include components selected from the group consisting of resistors, capacitors, diodes, transistors, integrated circuits, electrical connectors, and conductors.

7. The electrical apparatus of claim 1 wherein said number of electrical components not covered by said shield includes at least one light emitting diode.

8. The electrical apparatus of claim 1 wherein said at least one sheet member of said shield has a first thickness; wherein said generally planar member of said printed circuit board has a second thickness; and wherein the first thickness of said at least one sheet member of said shield is less than the second thickness of said generally planar member of said printed circuit board.

9. The electrical apparatus of claim 8 wherein the first thickness of said at least one sheet member of said shield is between about 0.005 inches and about 0.03 inches.

10. The electrical apparatus of claim 9 wherein the first thickness of said at least one sheet member of said shield is between about 0.01 inches and about 0.02 inches.

* * * * *